United States Patent
Tseng

Patent Number: 5,940,701
Date of Patent: Aug. 17, 1999

[54] METHOD FOR FORMING A DRAM CAPACITOR WITH FOUR POLYSILICON PILLARS

[75] Inventor: Horng-Huei Tseng, Hsinchu, Taiwan

[73] Assignee: Vanguard International Semiconductor Corporation, Hsinchu, Taiwan

[21] Appl. No.: 08/984,280

[22] Filed: Dec. 3, 1997

[51] Int. Cl.6 .............................................. H01L 21/8242
[52] U.S. Cl. ............................................. 438/253; 438/657
[58] Field of Search .................................... 438/253, 396, 438/595, 596, 647, 657, 669, 671

[56] References Cited

U.S. PATENT DOCUMENTS

| | | | |
|---|---|---|---|
| 5,604,146 | 2/1997 | Tseng | 438/253 |
| 5,807,775 | 9/1998 | Tseng | 438/253 |
| 5,811,331 | 9/1998 | Ying et al. | 438/253 |

*Primary Examiner*—Chandra Chaudhari
*Attorney, Agent, or Firm*—Christensen O'Connor Johnson & Kindness PLLC

[57] ABSTRACT

A method for forming a capacitor of a dynamic random access memory cell is disclosed. The method includes patterning a first polysilicon layer (124) over a semiconductor substrate, wherein at least a portion of the first polysilicon layer is communicated to the substrate. An anti-oxidation layer (125) is formed on the first polysilicon layer, wherein a portion of the first polysilicon layer is exposed. The first polysilicon layer is then thermally oxidized using the anti-oxidation layer as a mask, thereby forming poly-oxide (128) on sidewalls and the exposed surface of the first polysilicon layer. A portion of the first polysilicon layer is etched using the poly-oxide as an etch mask, thereby forming a trench in the first polysilicon. Thereafter, a pair of inner dielectric spacers (130A) is formed on inner sidewalls of the trench, and a pair of outer dielectric spacers (130B) on outer sidewalls of the poly-oxide. A pair of inner polysilicon spacers (132A) is formed on inner sidewalls of the inner dielectric spacers, and a pair of outer polysilicon spacers (132B) on outer sidewalls of the outer dielectric spacers. The inner dielectric spacers, the dielectric spacers, and a portion of the first polysilicon layer are removed, whereby lifting off the pair of outer polysilicon spacers. Finally, a dielectric layer (136) is formed on the first polysilicon layer, and the pair of inner polysilicon spacers, and then a conductive layer (138) is then formed on the dielectric layer.

10 Claims, 6 Drawing Sheets

METHOD FOR FORMING A DRAM CAPACITOR WITH FOUR POLYSILICON PILLARS

FIELD OF THE INVENTION

The present invention relates to dynamic random access memory (DRAM) fabrication, and more particularly, to a method for forming a capacitor of a dynamic random access memory cell.

BACKGROUND OF THE INVENTION

The growth in the popularity of electronic equipments, such as desktop and notebook computers, has increased the demand for large semiconductor memories. FIG. 1 shows a simplified diagram of the organization of a typical large semiconductor memory 14. The storage cells of the memory 14 are arranged in an array including horizontal rows and vertical columns. The horizontal lines connected to all of the cells in the row are referred to as word lines 11, and the vertical lines connected to all of the cells in the column are referred to as bit lines 13. Data flow into and out of the cells via the bit lines 13.

A row address 10 and a column address 12 are used to identify a location in the memory 14. A row address buffer 15 and a column address buffer 17, respectively, receive signals from row address 10 and signals from column address 12. The buffers 15 and 17 then drive these signals to a row decoder 16 and column decoder 18, respectively. The row decoder 16 and the column decoder 18 then select the appropriate word line and bit line corresponding to the received address signal. The word and bit lines select a particular memory cell of the memory 14 corresponding to the received address signals. As is known in the art of semiconductor memory fabrication, the row decoder 16 and the column decoder 18 reduce the number of address lines needed for accessing a large number of storage cells in the memory 14.

The array configuration of semiconductor memory 14 lends itself well to the regular structure preferred in "very large scale integration" (VLSI) ICs. For example, the memory 14 can be a dynamic random access memory (DRAM). DRAMs have become one of the most widely used types of semiconductor memory due to its low cost per bit, high device density and flexibility of use for reading and writing operations.

Previous DRAMs used storage cells where each cell consisting of three transistors and were manufactured using a P-type channel metal-oxide-semiconductor (PMOS) technology. Subsequently, a DRAM storage cell structure consisting of one transistor and one capacitor was developed. A circuit schematic diagram corresponding to this structure is shown in FIG. 2A. The gate of the transistor 20 is controlled by a word line signal, and data, represented by the logic level of a capacitor voltage, is written into or read out of the capacitor 22 through a bit line. FIG. 2B shows the cross section of a traditional one-transistor DRAM storage cell that uses a polysilicon layer 24 as one plate of the capacitor 22. The substrate region under the polysilicon plate 24 serves as the other capacitor electrode. A voltage can be applied to the plate 24 to store a logic value into the capacitor.

As the semiconductor memory device becomes more highly integrated, the area occupied by a capacitor of a DRAM storage cell typically shrinks. Thus, the capacitance of the capacitor 22 is reduced owing to its smaller electrode surface area. However, a relatively large capacitance is required to achieve a high signal-to-noise ratio in reading the memory cell and to reduce soft errors (due to alpha particle interference). Therefore, it is desirable to reduce the cell dimension and yet obtain a high capacitance, thereby achieving both high cell integration and reliable operation.

One approach for increasing the capacitance while maintaining the high integration of the storage cells is directed toward the shape of the capacitor electrodes. In this approach, the polysilicon layer implementing the capacitor electrodes may have protrusions, fins, cavities, etc., to increase the surface area of the capacitor electrode, thereby increasing the capacitor's capacitance while maintaining the small area occupied on the substrate surface. Consequently, this type of capacitor has come to be widely used in DRAM devices.

SUMMARY OF THE INVENTION

In accordance with the present invention, a method is provided for forming a capacitor of a dynamic random access memory cell that substantially increases the surface of the capacitor. In one embodiment, a first dielectric layer is formed on a semiconductor substrate, and the first dielectric layer is patterned to form a node contact in the first dielectric layer, and therefore exposing a portion of the substrate. A first polysilicon layer is formed on the first dielectric layer, wherein the first polysilicon layer fills the node contact in the first dielectric layer. An anti-oxidation layer is then formed on the first polysilicon layer. After forming a photoresist layer on the anti-oxidation layer, the anti-oxidation layer and the polysilicon layer are etched using the photoresist layer as a mask. A portion of the photoresist layer is laterally eroded, and the anti-oxidation layer is etched using the eroded photoresist layer as a mask, thereby exposing a portion of the first polysilicon layer. Thereafter, the first polysilicon layer is thermally oxidized using the anti-oxidation layer as a mask, and therefore forming poly-oxide on sidewalls and the exposed surface on the first polysilicon layer. A portion of the first polysilicon layer is then etched using the poly-oxide as an etch mask, therefore forming a trench in the first polysilicon, and a second dielectric layer is then formed over the poly-oxide, the first polysilicon layer, and the first dielectric layer. After anisotropically etching the second dielectric layer, a pair of inner dielectric spacers is formed on inner sidewalls of the trench, and a pair of outer dielectric spacers is formed on outer sidewalls of the poly-oxide. Subsequently, a second polysilicon layer is formed over the pair of inner dielectric spacers, the pair of outer dielectric spacers, the poly-oxide, the first polysilicon layer, and the first dielectric layer. The second polysilicon layer is then anisotropically etched so that a pair of inner polysilicon spacers is formed on inner sidewalls of the inner dielectric spacers, and a pair of outer polysilicon spacers is formed on outer sidewalls of the outer dielectric spacers. The inner dielectric spacers, the outer dielectric spacers, and a portion of the first polysilicon layer are removed, whereby lifting off the outer polysilicon spacers. A third dielectric layer is then formed on the first polysilicon layer and the second polysilicon layer, and a conductive layer is formed on the third dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
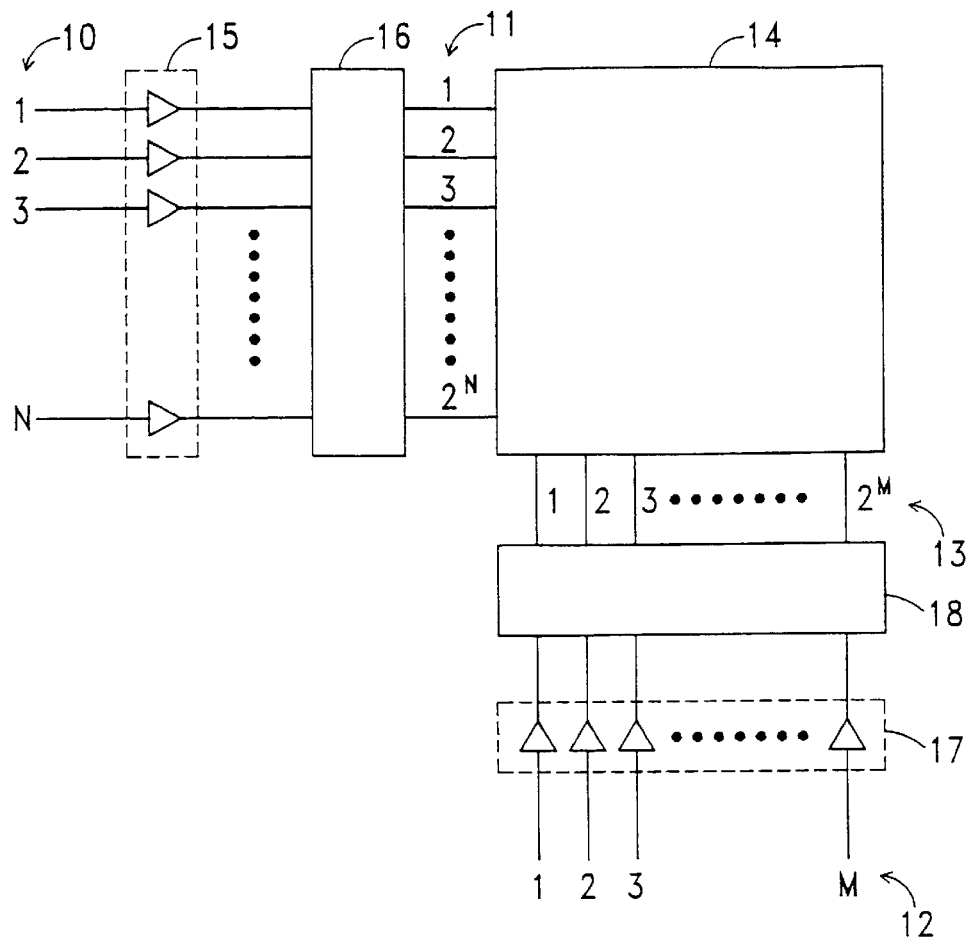
FIG. 1 shows a simplified diagram illustrative of the organization of a typical large semiconductor memory.
Figure 2A:
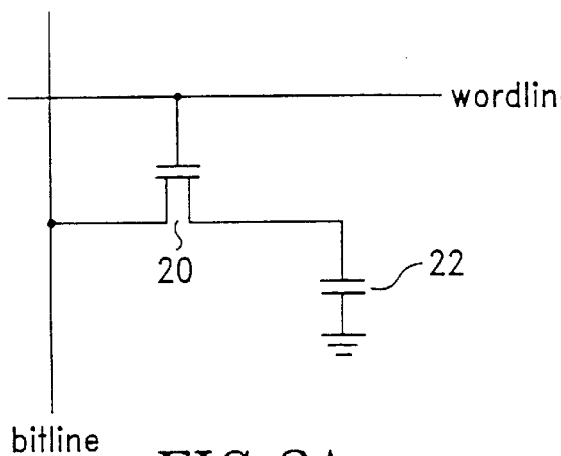
FIG. 2A shows a circuit schematic diagram of a typical one-transistor dynamic random access memory (DRAM) cell.
Figure 2B:
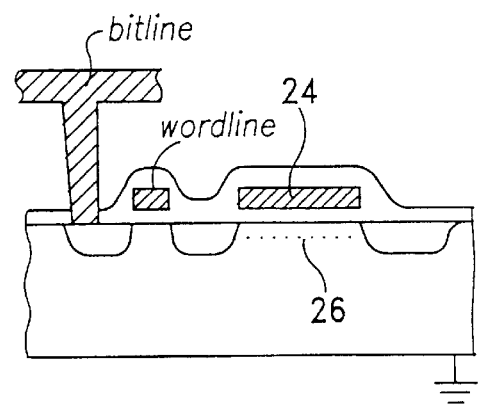
FIG. 2B shows a cross-sectional view illustrative of traditional one-transistor DRAM storage cell.
Figure 3:
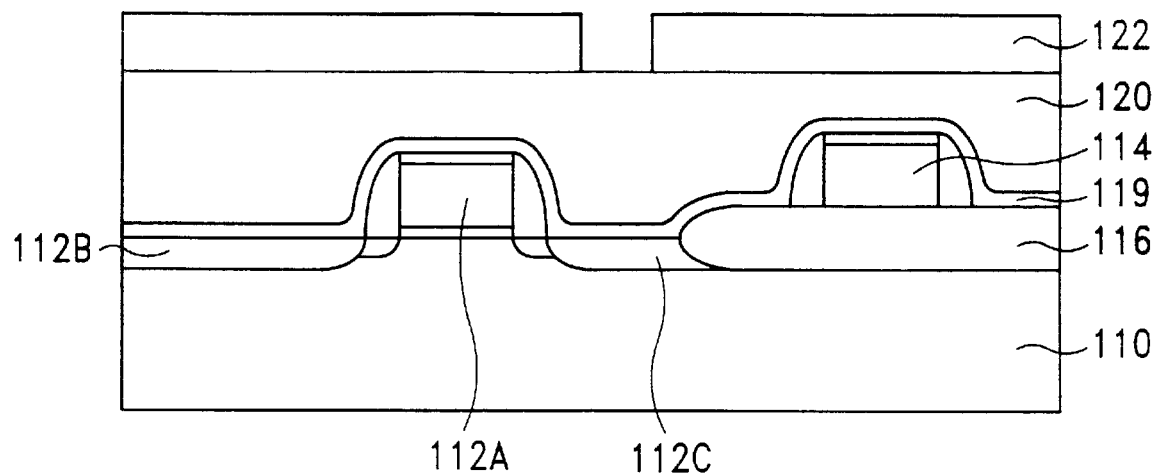
FIGS. 3–12 show cross-sectional views illustrative of various stages in the fabrication of a DRAM capacitor in accordance with the present invention.
Figure 4:
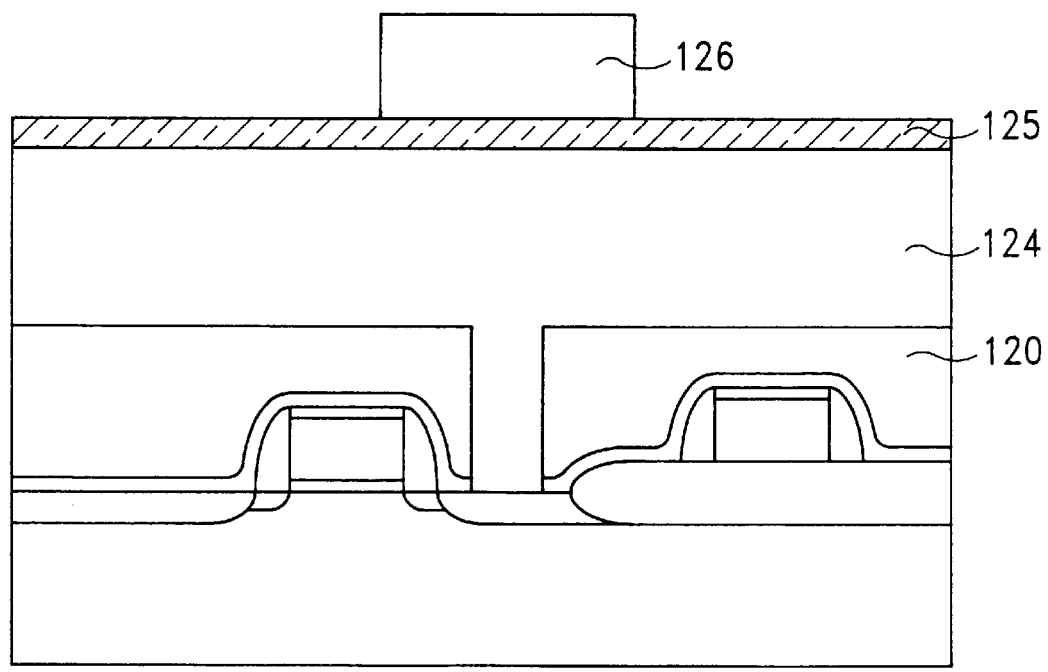

Referring to FIG. 3, a metal-oxide-semiconductor field effect transistor (MOSFET) having a gate 112A, a drain 112B and a source 112C, is conventionally formed in and on the substrate 110. A field oxide (FOX) region 116 is conventionally formed in the substrate 110 adjacent to the MOSFET for isolation purposes. A word line 114 is formed on the FOX region 116. In this embodiment, the MOSFET is an n-channel MOSFET that forms part of a DRAM cell.

A thin dielectric layer 119, such as an undoped oxide layer, is conformably deposited over the substrate 110 to a thickness, for example, of about 1000–2000 angstroms. Further, another dielectric layer 120, such as a doped silicon oxide layer or boro-phosphosilicate glass (BPSG), is deposited over the thin dielectric layer 119 using a conventional low pressure chemical vapor deposition (LPCVD) or plasma enhanced chemical vapor deposition (PECVD) process. The thickness of this silicon oxide layer 120 can range from about 3000 to 6000 angstroms.

The silicon oxide layer 120 is then planarized using any suitable conventional method such as an etch back process or a chemical mechanical polishing (CMP) process. A photoresist layer 122 is then formed and patterned on the silicon oxide layer 120 using conventional photolithographic techniques, defining a storage node contact area over a portion of the source 112C. A doped polysilicon layer 124 is then formed on the silicon oxide layer 120, and therefore filling the node contact in the silicon oxide layer 120. In this embodiment, the polysilicon layer 124 is deposited using a standard chemical vapor deposition process to a thickness of about 3000–8000 angstroms above the surface of the silicon oxide layer 120. Moreover, a thin dielectric layer 125, such as a silicon nitride layer, is formed on the polysilicon layer 124. In this embodiment, the silicon nitride layer 125 is deposited using a conventional low pressure chemical vapor deposition (LPCVD) or plasma enhanced chemical vapor deposition (PECVD). The thickness of the silicon nitride layer 125 is about 200 to 1000 angstroms. A photoresist layer 126 is then formed and patterned on the silicon nitride layer 125 using conventional photolithographic techniques, defining a pattern over the node contact. This pattern is larger than and approximately aligned with the node contact area.

Figure 5:
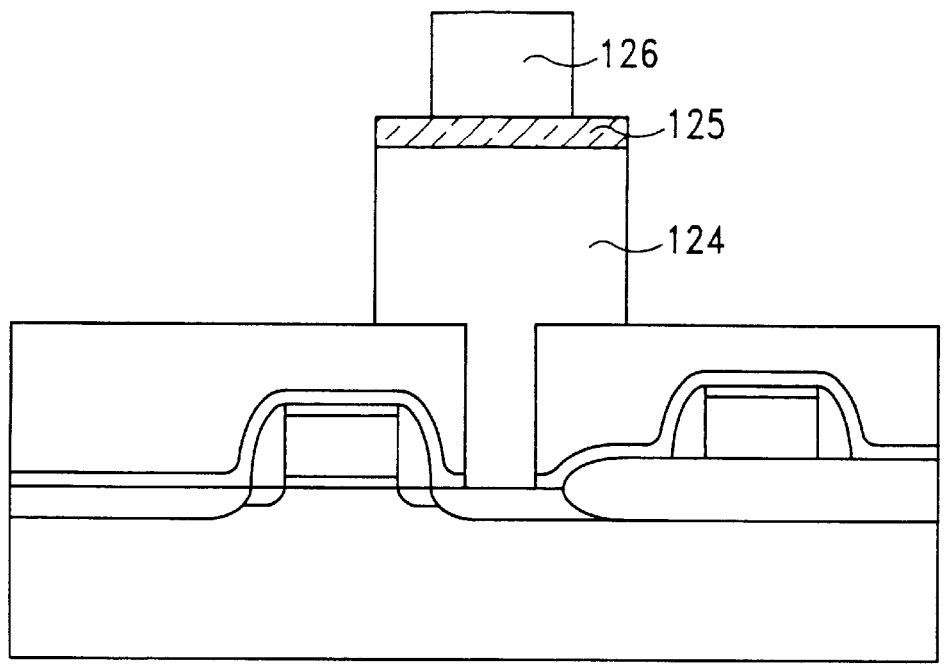
Figure 6:
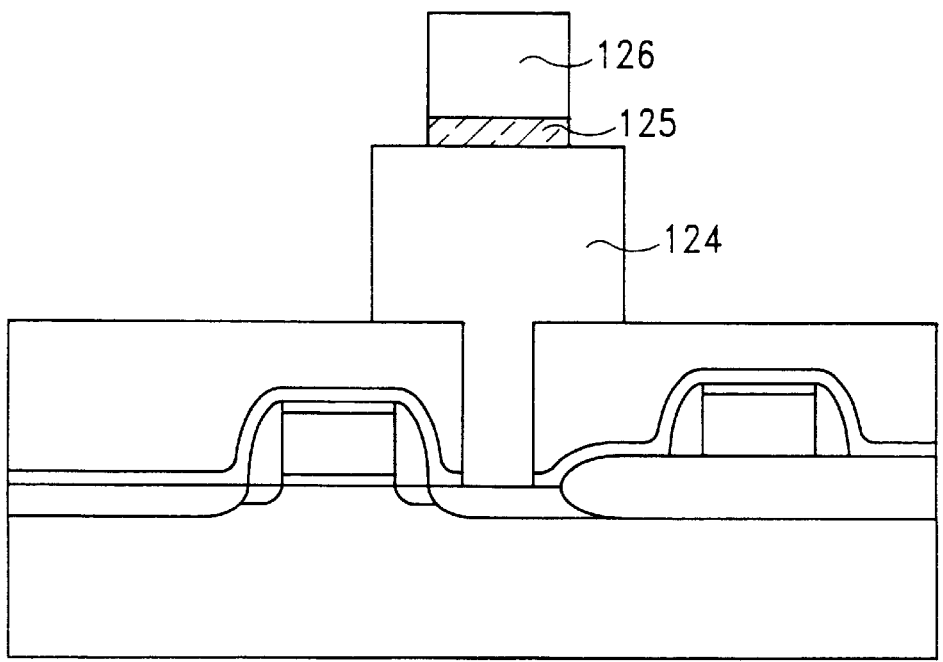

The silicon nitride layer 125 and the doped polysilicon layer 124 are etched back using the photoresist layer 126 as a mask, for example, by a plasma etch process such as reactive ion etch (RIE) and, therefore forming the structure as shown in FIG. 5. The photoresist layer 126 is subjected to lateral erosion (or isotropically etching), thereby exposing a portion of the surface of the silicon nitride layer 125 as shown in FIG. 5. The lateral etching of the photoresist layer 126 is performed, for example, by an oxygen plasma or $O_2+CF_4$ plasma. Referring to FIG. 6, the silicon nitride layer 125 is then etched using the eroded photoresist layer 126 as a mask, for example, by a plasma etch process such as reactive ion etch (RIE), thereby exposing a portion of the polysilicon layer 124.

Figure 7:
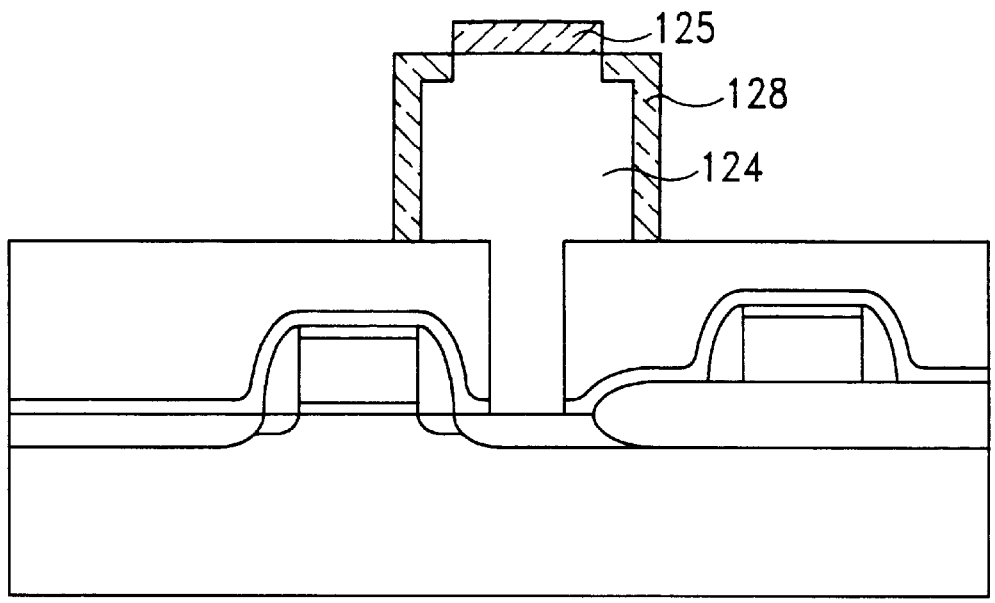

After the photoresist layer 126 is removed, the resulting structure is subjected to a thermal oxidation using the silicon nitride layer 125 as an anti-oxidation mask, and therefore forming a poly-oxide 128 on the sidewalls and the exposed top surface of the polysilicon layer 124 as shown in FIG. 7. The thickness of the poly-oxide 128 is preferably in the range of about 200–600 angstroms, which can be achieved under 700–900° C.

Figure 8:
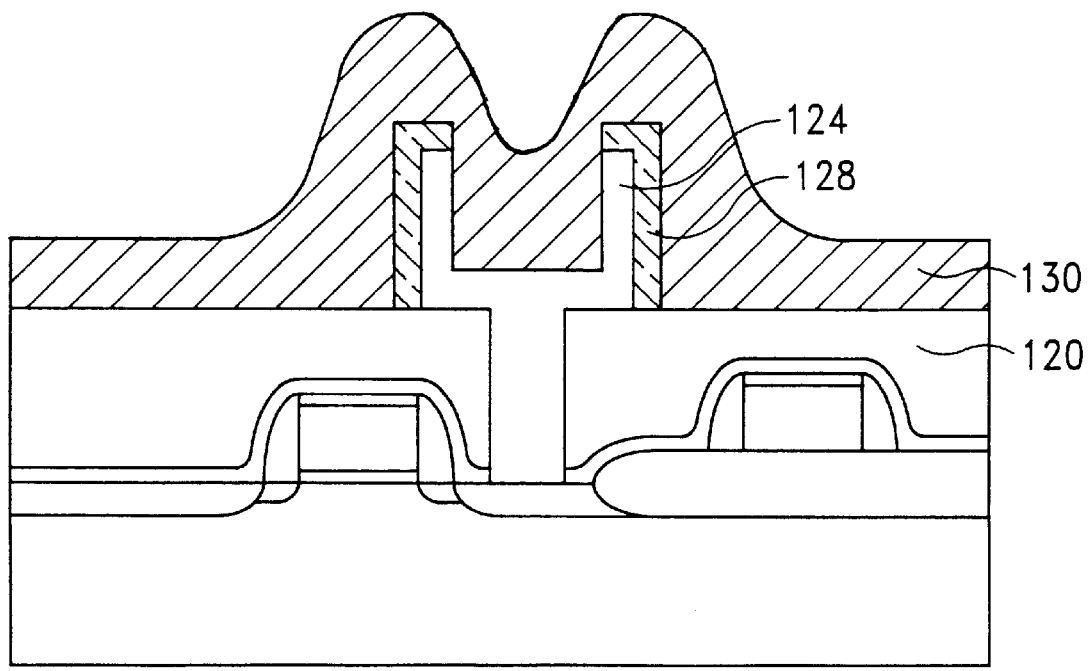

After removing the silicon nitride layer 125, for example, by using hot (about 160–180° C. phosphorus acid, a portion of the polysilicon layer 124 is anisotropically etched using the poly-oxide 128 as an etch mask, which has a high selectivity to the polysilicon layer 124. A trench is thus formed as shown in FIG. 8, which is preferably done using a magnetically enhanced reactive ion etch (MERIE) process. A dielectric layer 130, such as a doped silicon oxide or porous oxide, is deposited over the poly-oxide 128, the polysilicon layer 124, and the silicon oxide layer 120 to a thickness of about 800–2500 angstroms.

Figure 9:
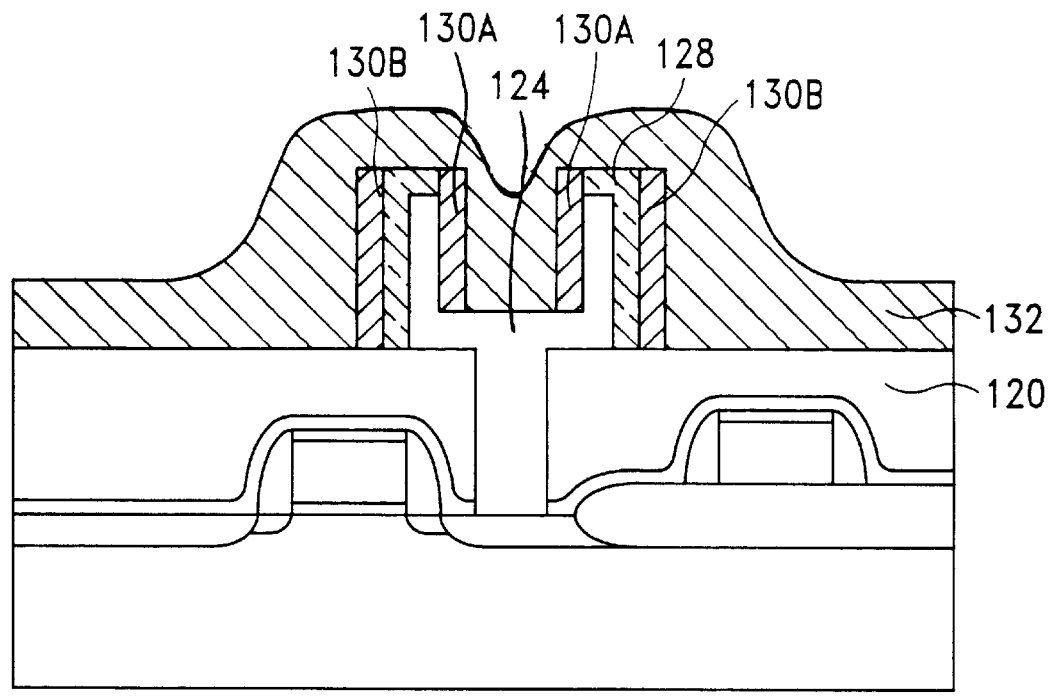

Thereafter, the dielectric layer 130 is etched back, forming a pair of inner dielectric spacers 130A on the inner sidewalls of the trench in the polysilicon layer 124, a pair of outer dielectric spacers 130B on the outer sidewalls of the poly-oxide 128 as shown in FIG. 9.

In FIG. 9, a polysilicon layer 132 is blanket deposited over the dielectric spacers 130A, 130B, the polysilicon layer 124, and the silicon oxide layer 120 to a thickness of about 800–2000 angstroms. Subsequently, the polysilicon layer 132 is etched back, for example, using a conventional plasma etch back process, and therefore forming a pair of inner polysilicon spacers 132A on the inner sidewalls of the inner dielectric spacers 130A inside the trench, and a pair of outer polysilicon spacers 132B on the outer sidewalls of the outer dielectric spacers 130B as shown in FIG. 10.

Figure 10:
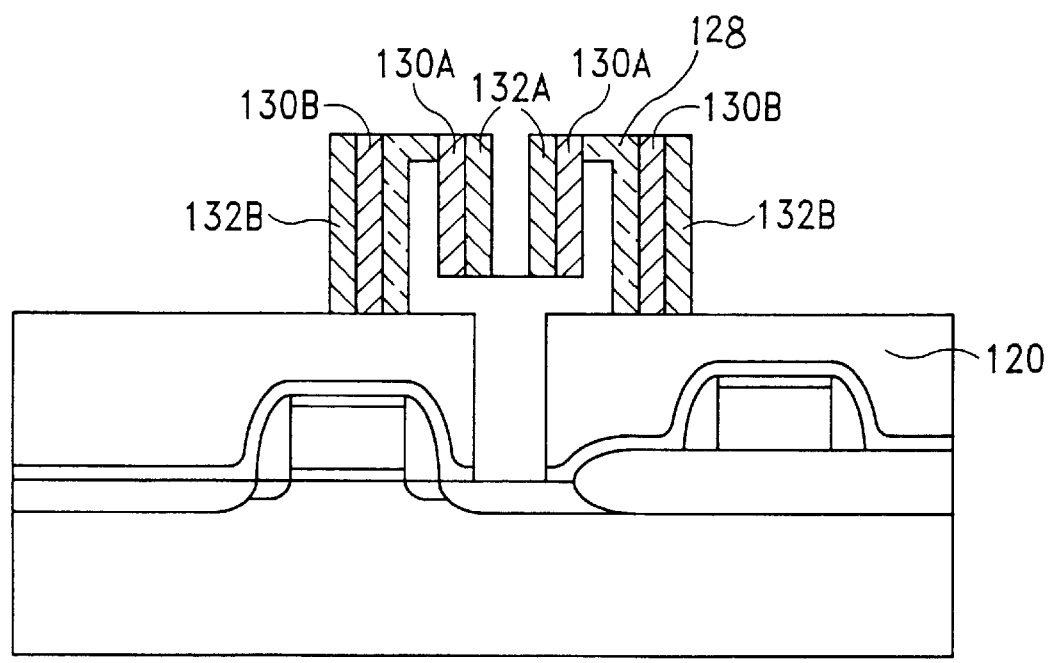
Figure 11:
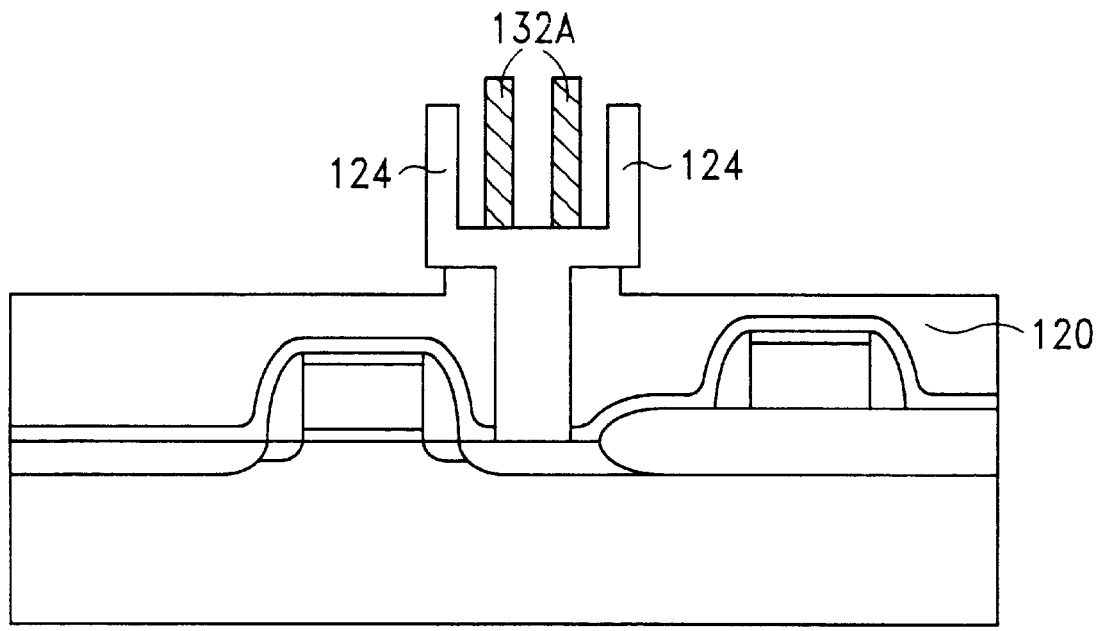

In FIG. 10, the poly-oxide 128, the pair of the inner dielectric spacers 130A, the pair of the outer dielectric spacers 130B, and a portion of the siliocn oxide layer 120 are etched using a conventional etching process, such as HF solution or HF vapor. It is noted that the pair of the outer polysilicon spacers 132B are lifted off during the etching process due to their loss of the resting places on the silicon oxide layer 120. FIG. 11 shows a resulting structure, which includes four polysilicon pillars 132A and 124.

Figure 12:
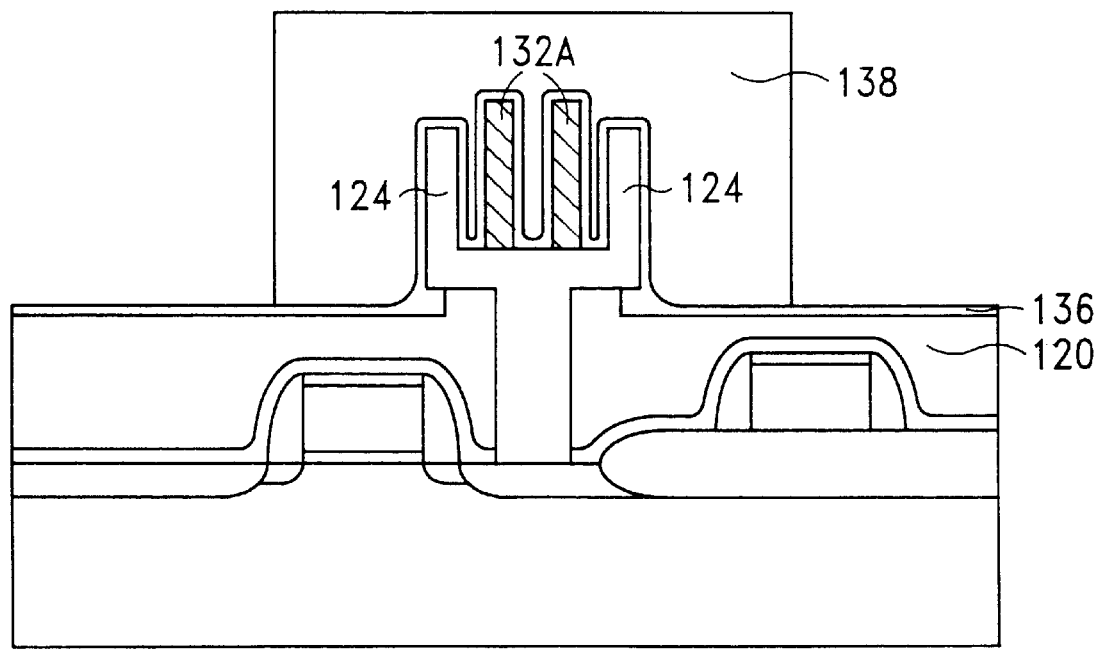

Referring to FIG. 12, a dielectric film 136 and a top electrode 138 of the DRAM cell capacitor can then be formed in a conventional manner. In this embodiment, a thin dielectric layer 136, such as stacked oxide-nitride-oxide (ONO) film, is formed on the exposed surface of the bottom electrode (i.e., the four polysilicon pillars 132A and 124) and the surface of the silicon oxide layer 120. As is known in the art of DRAM fabrication, the ONO film is reliable over shaped silicon surfaces, and is typically used as a capacitor insulator. The bottom oxide layer of the stacked oxide-nitride-oxide (ONO) film 136 is conventionally formed by thermally oxidizing the silicon surface, depositing an LPCVD silicon nitride layer and then oxidizing the silicon nitride layer to form the top oxide layer. A conductive layer 138 is then deposited over the stack oxide/silicon nitride/ oxide layer 136 to serve as an upper plate of the DRAM cell capacitor. The conductive layer 138 is typically a doped polysilicon layer formed in the same manner as the polysilicon layer 124.

Although specific embodiments have been illustrated and described, it will be obvious to those skilled in the art that various modifications may be made without departing from the spirit which is intended to be limited solely by the appended claims.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming a capacitor of a dynamic random access memory cell, said method comprising the steps of:

patterning a first polysilicon layer over a semiconductor substrate, at least a portion of said first polysilicon layer communicated to the substrate;

forming an anti-oxidation layer on said first polysilicon layer, wherein said portion of said first polysilicon layer is exposed;

thermally oxidizing said first polysilicon layer using the anti-oxidation layer as a mask, thereby forming poly-oxide on sidewalls and the exposed surface of said first polysilicon layer;

etching a portion of said first polysilicon layer using said poly-oxide as an etch mask, thereby forming a trench in said first polysilicon;

forming a pair of inner dielectric spacers on inner sidewalls of the trench, and forming a pair of outer dielectric spacers on outer sidewalls of said poly-oxide;

forming a pair of inner polysilicon spacers on inner sidewalls of said inner dielectric spacers, and forming a pair of outer polysilicon spacers on outer sidewalls of said outer dielectric spacers;

removing said pair of inner dielectric spacers, said pair of outer dielectric spacers, and a portion of said first polysilicon layer, whereby lifting off said pair of outer polysilicon spacers;

forming a dielectric layer on said first polysilicon layer, and said pair of inner polysilicon spacers; and forming a conductive layer on said dielectric layer.

2. The method according to claim 1, wherein said pair of inner dielectric spacers and said pair of outer dielectric spacers comprise doped silicon oxide.

3. The method according to claim 1, wherein said pair of inner dielectric spacers and said pair of outer dielectric spacers comprise porous oxide.

4. The method according to claim 1, wherein said anti-oxidation layer comprises silicon nitride.

5. A method for forming a capacitor of a dynamic random access memory cell, said method comprising the steps of:

forming a first dielectric layer on a semiconductor substrate;

patterning said first dielectric layer to form a node contact in said first dielectric layer, thereby exposing a portion of the substrate;

forming a first polysilicon layer on said first dielectric layer, said first polysilicon layer filling the node contact in said first dielectric layer;

forming an anti-oxidation layer on said first polysilicon layer;

forming a photoresist layer on said anti-oxidation layer;

etching said anti-oxidation layer and said polysilicon layer using said photoresist layer as a mask;

laterally eroding a portion of said photoresist layer;

etching said anti-oxidation layer using the eroded photoresist layer as a mask, thereby exposing a portion of said first polysilicon layer;

thermally oxidizing said first polysilicon layer using the anti-oxidation layer as a mask, thereby forming poly-oxide on sidewalls and the exposed surface of said first polysilicon layer;

etching a portion of said first polysilicon layer using said poly-oxide as an etch mask, thereby forming a trench in said first polysilicon;

forming a second dielectric layer over said poly-oxide, said first polysilicon layer, and said first dielectric layer;

anisotropically etching said second dielectric layer to form a pair of inner dielectric spacers on inner sidewalls of the trench, and to form a pair of outer dielectric spacers on outer sidewalls of said poly-oxide;

forming a second polysilicon layer over said pair of inner dielectric spacers, said pair of outer dielectric spacers, said poly-oxide, said first polysilicon layer, and said first dielectric layer;

anisotropically etching said second polysilicon layer to form a pair of inner polysilicon spacers on inner sidewalls of said inner dielectric spacers, and to form a pair of outer polysilicon spacers on outer sidewalls of said outer dielectric spacers;

removing said pair of inner dielectric spacers, said pair of outer dielectric spacers, and a portion of said first polysilicon layer, whereby lifting off said pair of outer polysilicon spacers;

forming a third dielectric layer on said first polysilicon layer and said second polysilicon layer; and forming a conductive layer on said third dielectric layer.

6. The method according to claim 5, wherein said first dielectric layer comprises doped silicon oxide.

7. The method according to claim 5, wherein said second dielectric layer comprises doped silicon oxide.

8. The method according to claim 5, wherein said second dielectric layer comprises porous oxide.

9. The method according to claim 5, wherein said anti-oxidation layer comprises silicon nitride.

10. The method according to claim 5, before forming said first dielectric layer, further comprising conformably forming a thin dielectric layer on the substrate.

* * * * *